United States Patent [19]
Kishida et al.

[11] Patent Number: 4,989,184
[45] Date of Patent: Jan. 29, 1991

[54] SEMICONDUCTOR MEMORY DEVICE HAVING CURRENT TYPE SENSE AMPLIFIER IMPROVED FOR HIGH SPEED OPERATION AND OPERATING METHOD THEREFOR

[75] Inventors: Satoru Kishida; Hisashi Matsumoto, both of Hyogo, Japan

[73] Assignee: Mitsubishi Denki Kabushiki Kaisha, Tokyo, Japan

[21] Appl. No.: 406,672

[22] Filed: Sep. 13, 1989

[30] Foreign Application Priority Data

Dec. 6, 1988 [JP] Japan ............................... 63-309241

[51] Int. Cl.$^5$ ............................................. G11C 11/34
[52] U.S. Cl. ..................................... 365/208; 307/530
[58] Field of Search ............... 365/205, 207, 208, 194, 365/189.09, 189.11; 307/530

[56] References Cited
FOREIGN PATENT DOCUMENTS
130492  8/1983  Japan .

OTHER PUBLICATIONS

M. Yoshida et al, "An 80ns Address-Data Multiplex 1Mb EMOS EPROM", Digest of Technical Papers, Feb. 1987, pp. 70-71.

Primary Examiner—Joseph A. Popek
Attorney, Agent, or Firm—Lowe, Price, LeBlanc, Becker & Shur

[57] ABSTRACT

In a read only memory, a current type sense amplifiers connected to an array of memory cells includes a charge supply circuit for maintaining an output voltage of an inverter. At the time of first accessing, when the input node is brought to temporarily increased potential level by the delay at the inverter, the node is maintained at a predetermined potential level by the operation of the circuit. In this manner, the time until the node is changed to the high level at the time of second accessing may be shortened. That is, the operating speed of the sense amplifier is increased.

12 Claims, 5 Drawing Sheets

1: SENSE AMPLIFIER   11: MEMORY ARRAY

1: SENSE AMPLIFIER   11: MEMORY ARRAY

22: ROW DECODER
24: COLUMN DECODER
38: Y GATE

SEMICONDUCTOR MEMORY DEVICE HAVING CURRENT TYPE SENSE AMPLIFIER IMPROVED FOR HIGH SPEED OPERATION AND OPERATING METHOD THEREFOR

BACKGROUND OF THE INVENTION

1. Field of the Invention

This invention relates in general to a semiconductor memory device and, more particularly, to a semiconductor memory device having a sense amplifier improved for a high speed operation.

2. Description of the Background Art

Although present invention is applicable both to a read only memory (ROM) and to a random access memory (RAM), the description is made by way of applying the invention to a ROM hereinafter.

FIG. 3 is a circuit diagram showing a conventional mask ROM. In this figure, an example of the mask ROM having only 16 memory cells is shown for simplifying the description. Referring to FIG. 3, this mask ROM includes an array of memory cell 11 having 16 memory cells 15, a row decoder 22 connected for receiving row address signals A0 and A1, a column decoder 24 connected for receiving column address signals A2 and A3, and a current type sense amplifier 1 for amplifying signals read out from the memory cell 15.

Word line drivers 20 for driving word lines 13 are connected between the outputs of the row decoder 22 and the array of memory cells 11. A column selector 38 is connected between the array of memory cells 11 and a sense amplifier 1. The column selector 38 includes four NMOS transistors connected between each bit line 14 and the input of the sense amplifier 1. These four transistors are turned on selectively responsive to output signals from the column decoder 24.

In operation, the row decoder 22 is responsive to the address signals A0 and A1 to set one of the word lines 13 to a high level. The column decoder 24 is responsive to the address signals A2 and A3 to turn on one transistor in the Y gate 38. As a result, data signals stored in one of the 16 memory cells are applied via Y gate 38 to the input of the sense amplifier 1. The sense amplifier 1 amplifies this signal to output the amplified signal.

FIG. 4 is a circuit diagram showing an example of the conventional current type sense amplifier. This sense amplifier may be seen for example in pages 70 and 71 of the Digest of Technical Papers of the IEEE International Solid State Circuits Conference held in 1987.

Referring to FIG. 4, the sense amplifier 1 includes an inverter 2 connected to an input node N1, a charge supply circuit 4 responsive to the output voltage of the inverter 2 to charge the node N1 to a predetermined potential, and an output circuit 3 responsive to the output voltage of the inverter 2 to output the amplified signal. The inverter 2 includes a PMOS transistor Q4 and an NMOS transistor Q5 connected in series between a source potential Vcc and a ground potential. Each of the transistors Q4 and Q5 has its gate connected together to the input node N1. The charge supply circuit 4 includes an NMOS transistor Q8 connected between the source potential Vcc and the node N1. The transistor Q8 has its gate connected to an output node of the inverter 2, referred to hereinafter as node N2. The output circuit 3 includes a PMOS transistor Q6 and an NMOS transistor Q7 connected in series between the source potential Vcc and the node N1. The transistor Q6 has its gate connected to the ground potential. The transistor Q7 has its gate connected to the node N2. The output signal of this sense amplifier 1 is outputted via a common connection node of the transistors Q6 and Q7.

In FIG. 4, for illustrating the operation of the sense amplifier 1, four of the memory cells Q1, Q2, Q11 and Q12 of the array of memory cells 11 are shown. The bit line BL1 connected to the transistors Q1 and Q2, is connected to the input node N1 of the sense amplifier 1 via NMOS transistor Q3 constituting the Y gate circuit. Similarly, the bit line BL11, connected to the transistors Q11 and Q12, is connected to the node N1 via the NMOS transistor Q13.

In a mask ROM, data signals to be stored in the ROM are written during in the manufacture process. The writing methods includes for example contact writing method in which data are written depending on whether or not a window for connection to the drain of the field effect transistor constituting the memory cell and an ion implantation writing method in which data are written by selectively forming a depletion type transistor or on enhancement type transistor by ion implantation. No matter which of the methods is applied, the data signals written in the memory cells are read out by sensing whether the transistor constituting the selected memory cell is turned on or not. In the following description, it is assumed that, when a memory cell is selected, the data "0" is stored in the memory cell when the transistor therein is turned on and the data "1" is stored in the memory cell when the transistor is turned off.

The operation of this prior art circuit is hereinafter explained. In the following description, it is assumed that the data "1" is stored in the memory cell including the transistor Q1, and that the data "0" is stored in the memory cell including the transistor Q2.

The operation in the sense amplifier 1 before the start of the readout operation, that, is, before the when the transistor Q3 and Q13 are turned off, is first explained. When the node N1 is at a low level potential, transistor Q4 is turned on, while transistor Q5 is turned off. Thus, the inverter 2 outputs a high level voltage to set the node N2 to a high level. Transistors Q7 and Q8 are turned on responsive to the voltage at the node N2. When the transistor Q8 is turned on, the potential at the node N1 starts to be increased. In the inverter 2, the transistors Q4 and Q5 are turned off and on, respectively, responsive to the increased potential at the node N1. As a result, when the voltage at the node N2 is decreases to a voltage lower than the sum of the voltage at the node N1 and the threshold voltage Vth of the transistor Q8, the transistor Q8 is turned off. Hence, the potential at the node N2 ceases to be increased and, responsive thereto, the potential at the node N2 also ceases to be lowered. The potential at the node N1 at this time is expressed as V01, while that of the node N2 is expressed as V02.

On the other hand, when the node N1 is set to a potential higher than V01, the inverter 2 affords a potential lower than V02 to the node N2. Since the transistors Q7 and Q8 are turned off responsive to the voltage lower than V02, the potential at the node N1 is not changed.

It is seen from the foregoing that, before the read out operation, the node N1 is set to the potential not lower than V01, and the node N2 is brought to the potential not higher than V02.

It is now explained that the bit line in general is previously brought to the low level potential. For example, when the memory cell including the transistor Q12 is accessed, a high level voltage is applied from the row decoder to the word line WL2. The transistor Q12 is turned on or off on the basis of the stored data signal. On the other hand, the transistor Q2 is also turned on, since the signal "0" is stored in the memory cell including the transistor Q2. As a result, the bit line BL1 is connected to the ground potential via transistor Q2. In general, since the array of memory cells 11 includes at least some memory cells in which data signals "0" are stored, the majority of the bit lines are usually brought in advance to the low level potential.

FIG. 5 is a timing chart for illustrating the read out operation by the sense amplifier shown in FIG. 4. Referring to FIGS. 4 and 5, the read out operation may be explained for the case in which the data signals stored in the memory cell including the transistor Q1 and the memory cell including the transistor Q2 are read out sequentially from these memory cells.

When the transistor Q1 is accessed, the word line WL1 is brought to the high level by the row decoder, while the column decoder outputs a high level signal Y1. The transistor Q3 is turned on responsive to the signal Y1. The transistor Q1 is not capable of being turned on since the data "1" is stored therein. Since the bit line BL1 is brought previously to the low level potential, the bit line BL1 is charged rapidly by the sense amplifier 1 after the transistor Q3 is turned on. Thus, the potential at the node N1 is lowered temporarily. Since the potential at the node N2 is responsive to the changes in the potential of the node N1 to be increased temporarily by the inverter 2, transistor Q8 is responsive thereto to be turned on. With the transistor Q8 turned on, the node N1 and the bit line BL1 are charged rapidly. As the potential at the node N1 is increased by this charging, the potential at the node N2, increased temporarily as described above, starts rapidly to be lowered under the operation of the inverter 2. Since the inverter 2 outputs the inverted voltage with a delay, the potential at the node N2 is not lowered to V02 when the potential at the node N1 reaches V01. Hence, the transistor Q8 remains ON, so that the node N1 is charged further and brought to a potential higher than V01. When the potential at the node N2 is lowered by the inverter 2 to V02, transistor Q8 is turned off. At this time, the node N1 is already brought to a potential exceeding V01. Responsive to the voltage at the node N1 at this time, the channel resistance of the transistor Q4 is high and the channel resistance of the transistor Q5 is low, as compared to the case in which the potential at the node N1 is V01. As a result, the charges at the node N2 are discharged via transistor Q5 and the potential at the node N2 is lowered to the vicinity of the ground level.

The output circuit 3 is responsive to the voltage at the node N2 to output a high level output signal So.

This state is not changed even after transistor Q3 is turned off. Although it is assumed in the above example that the node N1 is at the potential of V01 in the initial state, the potential at the node N1 after the charging of the bit line BL1 is approximately equal to that of the present example even when the voltage at the node N1 is at a potential higher than V01. It is because the parasitic capacitance on the bit line BL1 is sufficiently large as compared to the capacitance proper to the node N1.

The case of the transistor Q2 being accessed after this state is explained. For accessing the transistor Q2, the word line WL2 is brought to the high level by the row decoder, while the column decoder outputs a high level signal Y1. The transistor Q3 is turned on responsive to the signal Y1. Since the transistor Q2 is also turned on responsive to the voltage applied to the word line WL2, there is formed a current path connecting the node N1 to the ground potential by way of transistor Q3, bit line BL1 and transistor Q2. Thus the potential at the node N1 and the bit line BL1 is lowered. The inverter 2 is responsive to the potential at the node N1 to raise the potential at the node N2. As a result, transistors Q8 and Q7 are turned on and the output circuit 3 outputs a low level output signals So.

As described above, the node N2 was brought to close to the ground potential by previously accessing the transistor Q1, so that, when transistor Q2 is accessed, it takes some time until the potential at the node N2 is raised by the inverter 2. As a result, the transistor Q7 in the output circuit 3 is turned on with a delay, that is, as shown in FIG. 5, a longer time is elapsed since the rising of the voltage at the word line W2 or the output signal Y1 of the column decoder until the falling of the output signal So. This means that the readout speed is low.

A prior art technology having particular interest to the present invention is seen in the Japanese Patent Laying Open No. 130492/1983. In this prior art, a sense amplifier is disclosed. This sense amplifier includes a circuit for previously maintaining an input node of the sense amplifier connected to the bit line, that is, the node corresponding to the node N1 shown in FIG. 4, at a predetermined potential.

SUMMARY OF THE INVENTION

It is an object of the present invention to raise the operating speed of the sense amplifier in the semiconductor memory device.

It is another object of the present invention to increase further the speed of amplification in a current type sense amplifier.

It is yet another object of the present invention to improve the operating speed of a sense amplifier of a type having an input node and an output circuit driven by a second node wherein the input node and the second node interconnected by an inverter and the second node controls a current flow path to the input node.

Stated briefly, the semiconductor memory device according to the present invention includes a plurality of memory cells each connected between a bit line and a predetermined first potential and responsive to an address signal to afford the data signal stored therein to the bit line, a sense amplifier for amplifying the voltage on the bit line, and a first switching element connected between the bit line and the sense amplifier and operated responsive to the address signal. The sense amplifier has its input connected via the first switching element to the bit line at the first node. The sense amplifier include an inverter responsive to the voltage at the first node for output an inverted voltage with a delay, a second switching element connected between a predetermined second potential and the first node and operated responsive to the potential of the inverter output, a potential holding circuitry for holding the inverter output at a potential not substantially lower than a predetermined third potential, and an amplification circuitry responsive to the inverter output potential for outputting an amplified signal. The third potential is a potential intermediate between the first and the second potentials.

In operation, the bit line may be occasionally brought to a potential close to the first potential before turning on of the first switching element. In this case, the first node is brought under this effect to a potential closer to the second potential after turning on of the switching element. At this time, the potential of the inverter output tends to be changed towards the first potential under the inverter operation. However, since the potential holding circuitry is connected to the inverter output, the inverter output is maintained at a potential not substantially lower than the third potential. As a result, the extent of the changes in the voltage outputted from the inverter during the readout operation is decreased. As a result, the amplification circuit operated responsive to the inverter output voltage outputs the amplified signals more quickly.

In another aspect, the sense amplifier of the present invention amplifies the input signals supplied to the input node. The input node may be brought occasionally to the predetermined first potential before the input signal is supplied thereto. This sense amplifier includes an inverter responsive to the voltage at the first node to output an inverted voltage with a delay, a switching element connected between the predetermined second potential and the first node and operated responsive to the potential of the inverter output, a potential holding circuitry for holding the inverter output at a potential not substantially lower than the predetermined third potential, and an amplification circuitry responsive to the inverter output potential for outputting an amplified signal. The third potential is a potential intermediate between the first and the second potentials.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
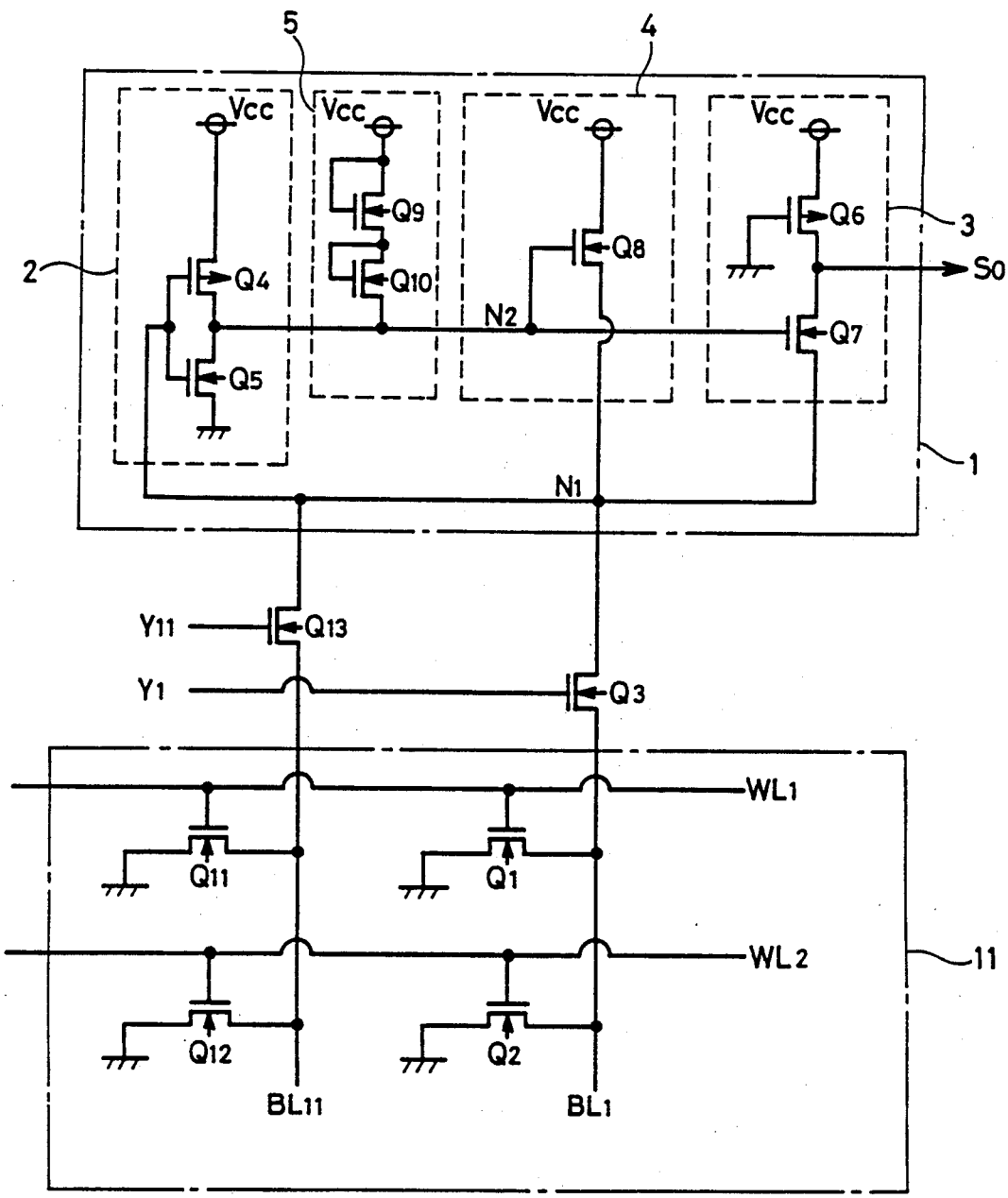
FIG. 1 is a circuit diagram of a sense amplifier showing an embodiment of the present invention.
Figure 4:
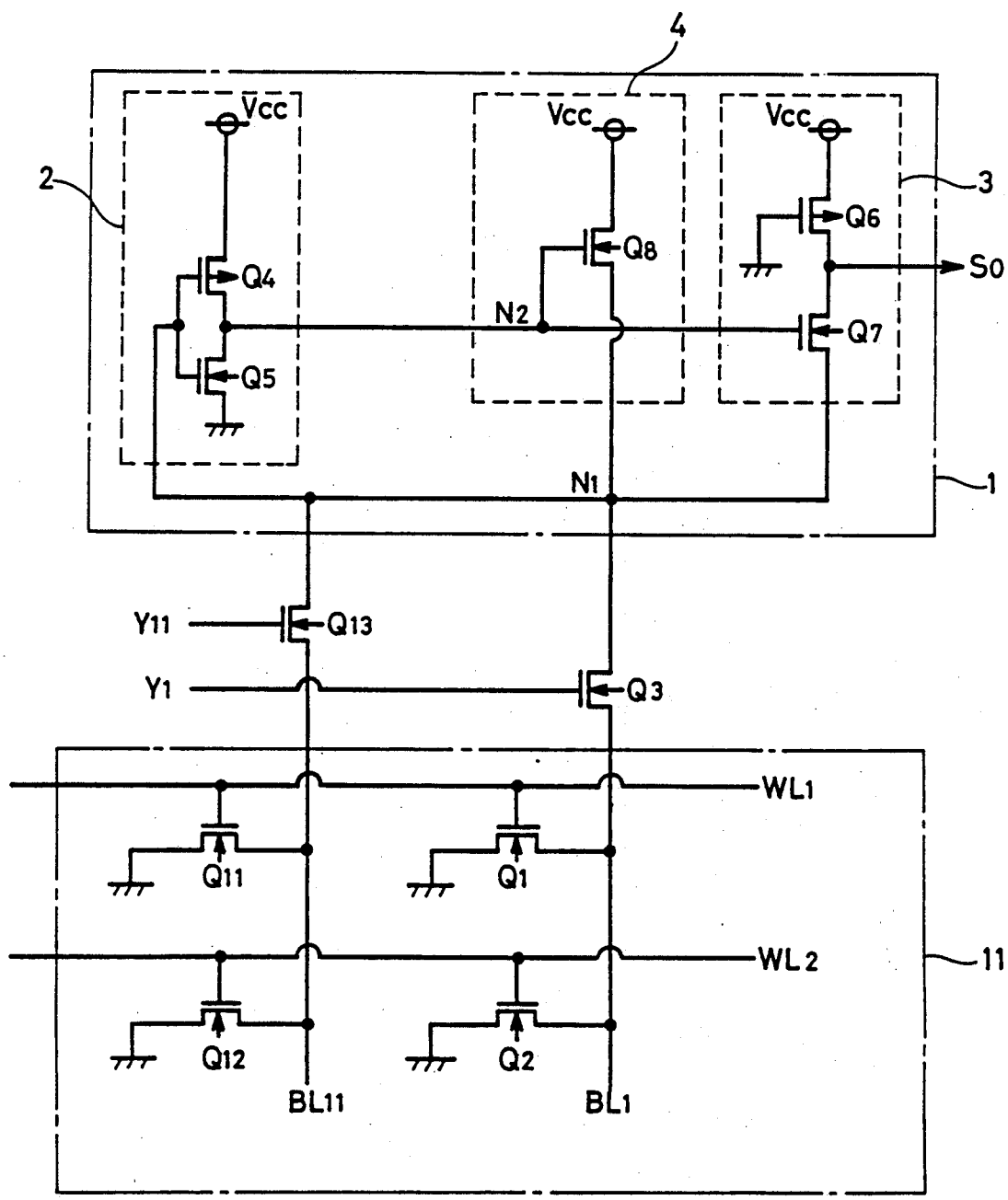
FIG. 4 is a circuit diagram showing an example of a conventional sense amplifier.

FIG. 1 is a circuit diagram showing a current type sense amplifier according to an embodiment of the present invention. Referring to FIG. 1, the circuit shown therein differs from a conventional circuit shown in FIG. 4 in that an additional charge supply circuit 5 is provided in this sense amplifier 1. That is, the charge supply circuit 5 is connected to the output node N2 of the inverter 2. The charge supply circuit includes two NMOS transistor Q9 and Q10 connected in series between the source potential Vcc and the node N2. Each of the transistors Q9 and Q10 has its gate connected to its drain. Each of the transistors Q9 and Q10 is turned on when the voltage across its sources and gate exceeds a threshold voltage Vth to prevent the occurrence of the situation in which the voltage across the source and the drain is increased to higher than the threshold voltage. As a result, the charge supply circuit 5 prevents the occurrence of the situation in which the potential at the node N2 is lowered to a potential lower than a potential equal to the source potential Vcc less the sum of the threshold voltages of the two transistors Q9 and Q10, or 2 Vth, referred to hereinafter as the potential VR.

The status of the sense amplifier before the readout operation is explained. At this time, the transistors Q3 and Q13 are turned off, while the sense amplifier 1 is not connected to the bit line BL1 or BL11. When the node N1 is brought to the low level, the node N2 is brought to the high level by the inverter 2. The transistors Q7 and Q8 are turned on responsive to the potential at the node N2. The potential at the node N1 is raised responsive to the turning on of the transistor Q8. On the other hand, the potential at the node N2 is lowered by the operation of the inverter 2. When the potential at the node N2 is lowered to a value lower than the sum of the potential at the node N1 and the threshold voltage Vth of the transistor Q8, transistor Q8 is turned off. It is noted that the voltage VR, which is preset for a particular charge supply circuit 5, is set so as to be slightly lower than the potential at the node N2 at this time. As a result, the potential at the node N1 ceases to be increased, while the potential at the node N2 ceases to be lowered. The potential at the node N1 at this time is expressed as V01, and that at the node N2 is expressed as V02.

On the other hand, when the node N1 is brought to the high level, the node N2 tends to be brought to the low level by the inverter 2. However, when the potential at the node N2 is changed to lower than VR by the inverter 2, transistors Q9 and Q10 in the current supply circuit 5 are turned on. Thus the current flows from the source potential Vcc to the ground via transistors Q9, Q10 and Q5. As a result, the potential at the node N2 is determined, by the ratio of the sum of on-resistance of the transistors Q9 and Q10 to the on-resistance of the transistor Q5.

Figure 2:
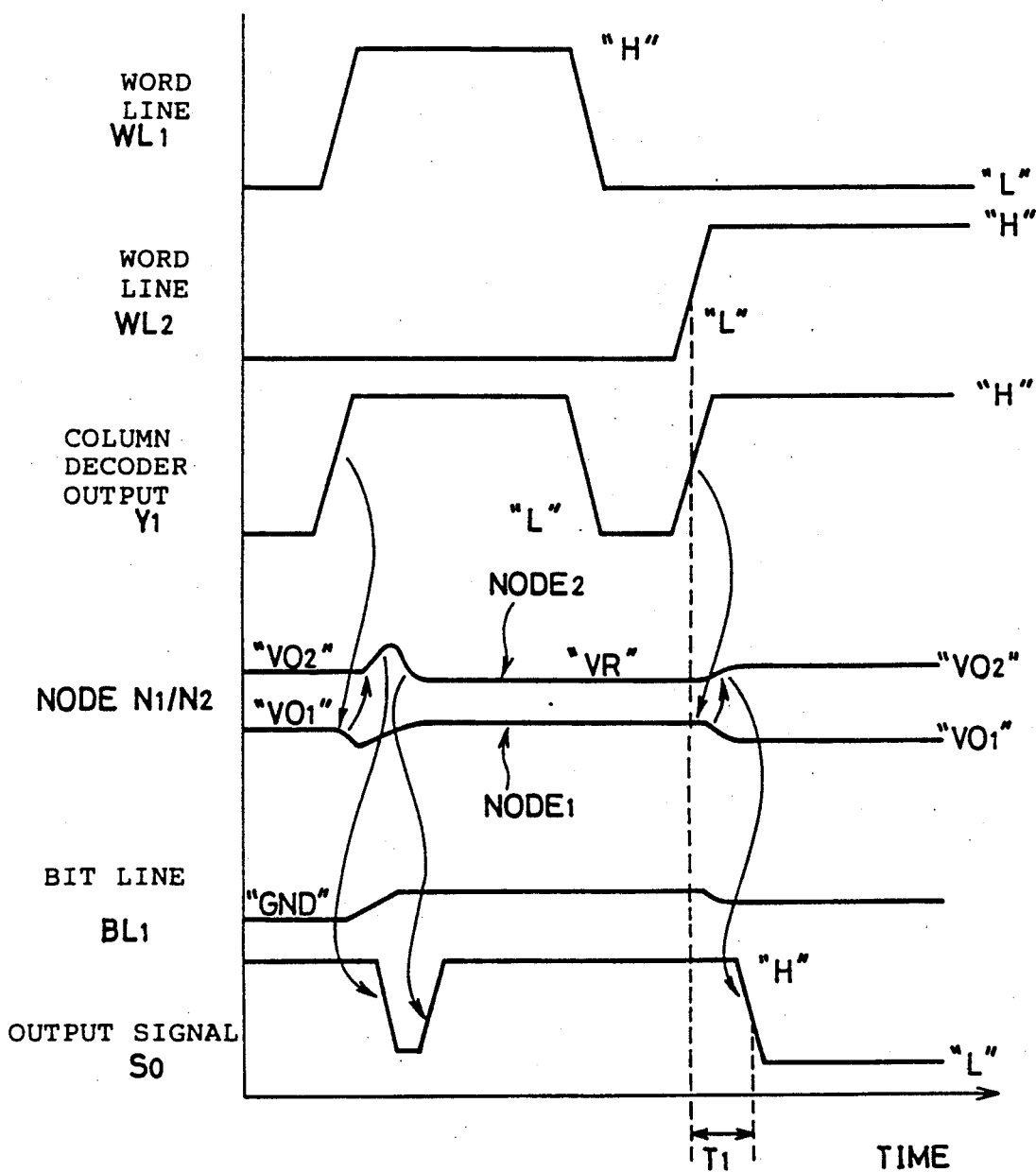
FIG. 2 is a timing chart for illustrating the readout operation by the sense amplifier shown in FIG. 1.
Figure 3:
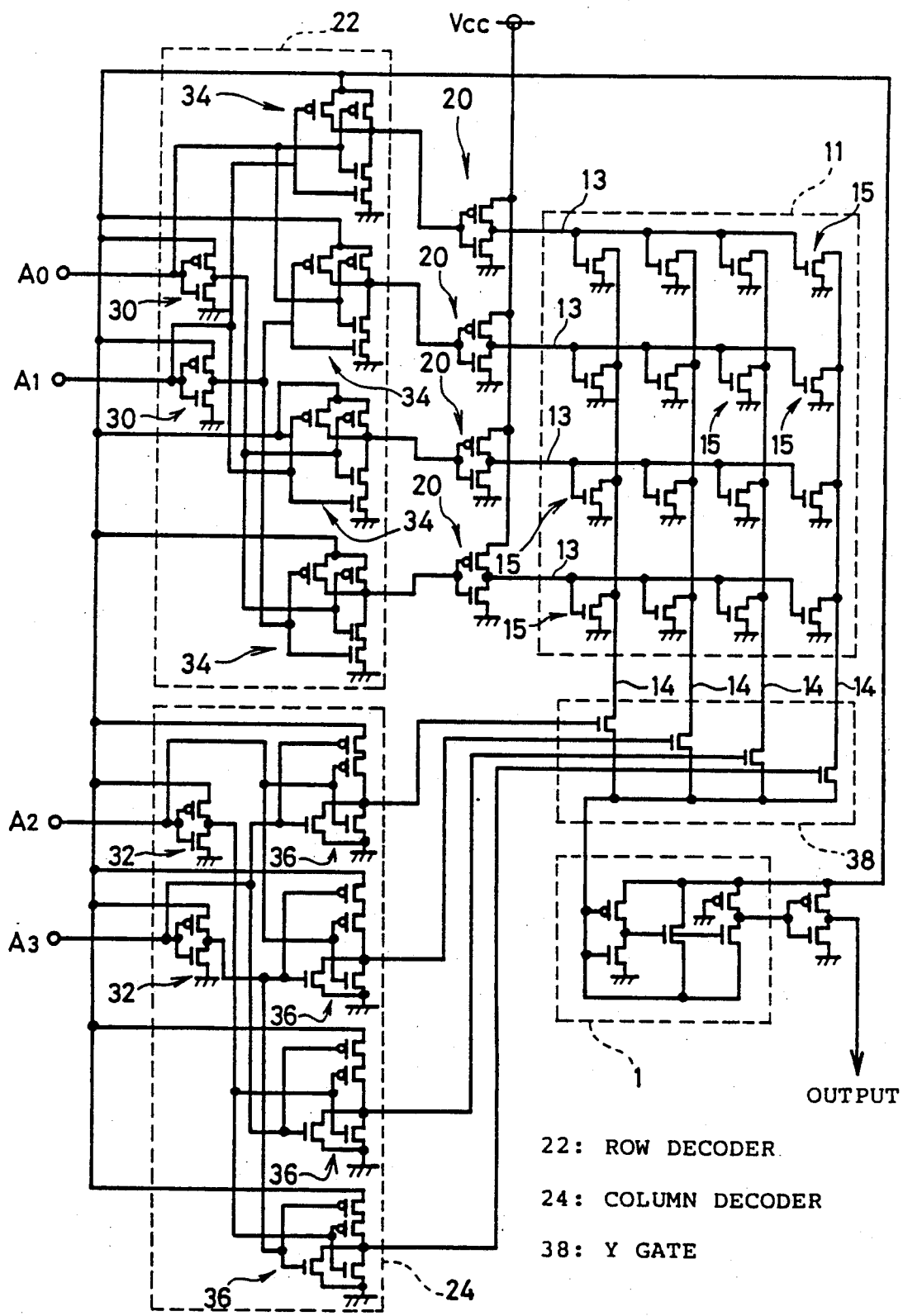
FIG. 3 is a circuit diagram showing a conventional mask ROM.

FIG. 2 is a timing chart for illustrating the readout operation by the sense amplifier shown in FIG. 1. Then, referring to FIGS. 1 and 2, the operation of the circuit when the memory cell including the transistor Q1 and the memory cell including the transistor Q2 are accessed sequentially.

In the following description, it is assumed that the signal "1" is stored in the memory cell including the transistor Q1 and the signal "0" is stored in the memory cell including the transistor Q2. That is, it is assumed that, when the transistor Q1 is accessed, transistor Q1 is turned off and, when the transistor Q2 is accessed, transistor Q2 is turned on.

When transistor Q1 is accessed, the word line WL1 is brought to the high level by the row decoder, and a high level signal Y1 is outputted from the column decoder. Transistor Q3 is turned on responsive to the signal Y1, while transistor Q1 is not turned on. As described hereinabove, the bit line BL1 is previously set to the ground potential. After the transistor Q3 is turned on, the bit line BL1 is charged rapidly by the sense amplifier 1. Thus, the potential at the node N1 is lowered temporarily, while the potential at the node N2 is increased rapidly temporarily. Since the transistor Q8 is turned on responsive to changes in the potential at the node N2, the node N1 and the bit line BL1 are charged rapidly via transistor Q8. When the potential at the node N1 is increased by such charging, the potential at the node N2, increased temporarily as described hereinabove, starts to be lowered rapidly. When the potential at the node N1 reaches V01, the potential at the node N2 is not lowered to V02 due to the effect of delay at the inverter 2. Thus, transistor Q8 continues to be turned on, so that the node N1 is charged further and hence, its potential is increased.

When the potential at the node N2 is lowered to V02, transistor Q8 is turned off. At this time, the node N1 is already brought to the potential higher than V01. As a result, the on-resistances of the transistors Q4 and Q5 in the inverter 2 are higher and lower respectively, than in the case in which the potential at the node N1 is V01. The charges at to the node N2 are discharged via transistor Q5, so that the potential at the node N2 is lowered to below V02. When the potential at the node N2 reaches VR, transistors Q9 and Q10 in the charge supply circuit 5 are turned on. In this manner, the potential at the node N2 is prevented from being lowered, or in other words, the node N2 is maintained at a potential approximately equal to VR.

Then, transistor Q2 is accessed. The word line WL2 is brought to the high level, and a high level signal Y1 is supplied to turn on the transistors Q3 and Q2. The charges at the node N1 are discharged via transistor Q3, bit line BL1 and transistor Q2. Hence, the potential at the node N1 and bit line BL1 is lowered, while the potential at the node N2 is increased by the operation of the inverter 2. Since the potential at the node N2 rises from the potential close to VR under the operation of the inverter 2, the time that elapses until the transistor Q7 is turned on responsive to the potential at the node N2 is shortened. The output circuit 3 outputs a low level signal So by the timing on of the transistor Q1.

Figure 5:
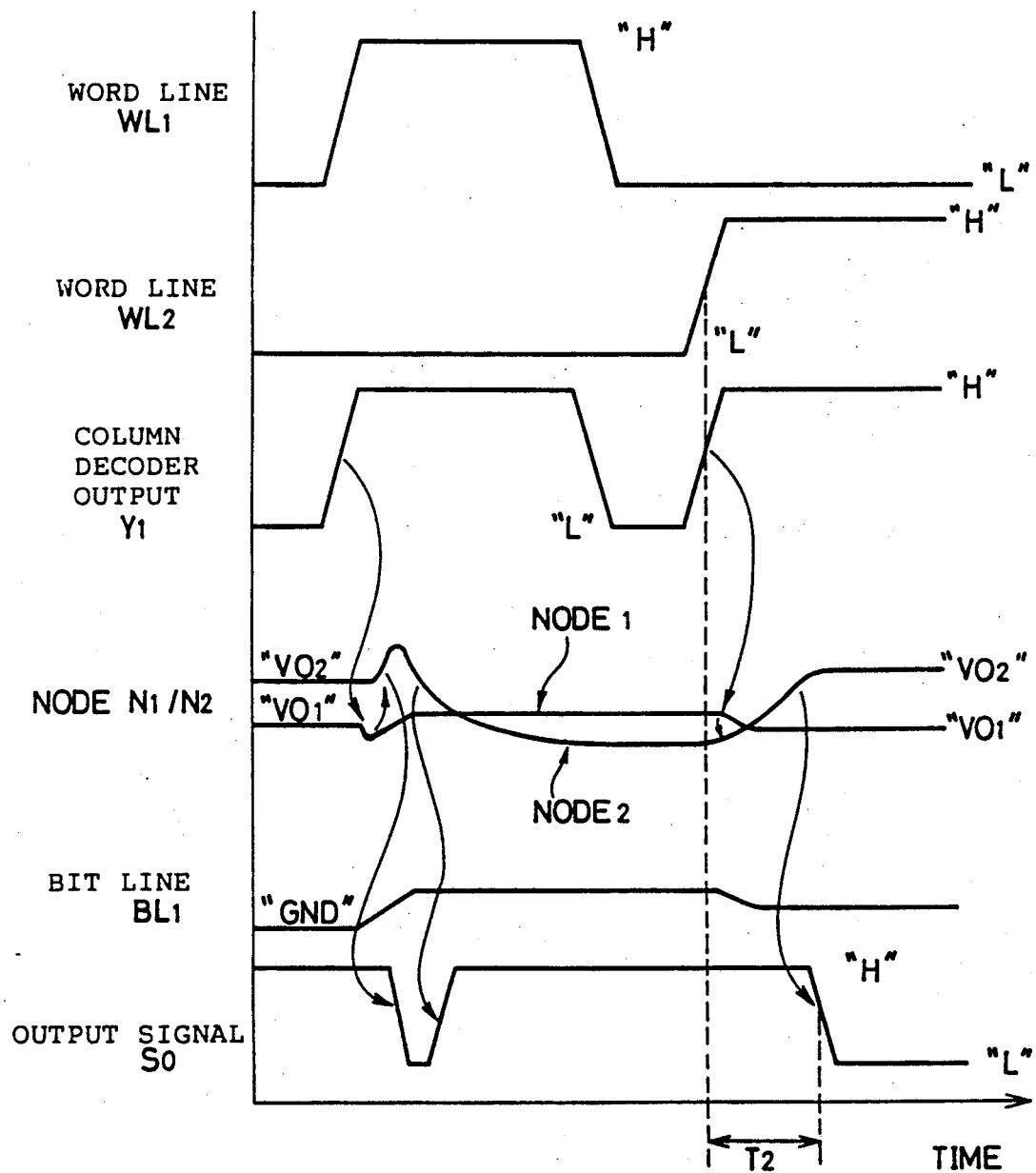
FIG. 5 is a timing chart for illustrating the readout operation by the sense amplifier shown in FIG. 4.

As shown in FIG. 2 the time T1 that elapses since the rising of the voltage at the word line WL2 or the rising of the output signal Y1 of the column decoder until the falling of the output signal So is shorter than the time T2 shown in FIG. 5. It is because the potential at the node N2 is maintained at a value about equal to VR by the charge supply circuit 5. That is, since the potential at the node N2 is changed rapidly from VR by the inverter 2, transistor Q7 is turned on quickly. As a result, the low level output signal S5 is outputted more quickly than in the conventional circuit.

Although the charge supply circuit 5 is formed by two NMOS transistors Q9 and Q10 in the above embodiment, these transistors may be replaced by diodes, in which case the diodes are connected so that the forward current flows from the source potential Vcc towards the node N2.

Although the sense amplifier is constituted by a CMOS circuit in the above embodiment, it may be constituted by an NMOS circuit in which there may be provided various transistors for saving the power consumption. And there may be provided a current leak path from the node N1 to the ground potential, for instance a small NMOS transistor is connected between the node N1 and the ground potential. The transistor has its gate connected to the node N2.

Finally, although the description of the above embodiment has been made of the case in which the sense amplifier 1 is used for ROMs, this sense amplifier 1 may be applicable in general to random access memories (RAMs).

In the sense amplifier shown in FIG. 1, after the transistor Q3 is turned for first accessing, the node N1 is brought to an additionally high potential level by the turning on of the transistor Q8. Hence, by the operation of the inverter 2, the node N2 tends to be changed towards a ground potential. However, since the charge supply circuit 5 holds the node N2 at a potential about equal to VR, the potential at the node N2 is increased in a short time at the time of second accessing. As a result, transistor Q1 may be turned on quickly. That is, the amplification speed of this current type sense amplifier 1 or the operating speed of the sense amplifier in the semiconductor memory device may be made higher than in the conventional circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising receiving means for receiving address signals,
   bit lines,
   a plurality of memory cells each connected between said bit lines and a predetermined first potential and responsive to said address signals received by said receiving means to supply data signals stored therein to said bit lines,
   a sense amplifier for amplifying a voltage applied to said but lines, and
   first switching means connected between said bit lines and said sense amplifier for operating and operable in response to said address signals,
   said sense amplifier having its input connected via said first switching means to said bit lines at a first node,
   wherein said sense amplifier includes first inverter means connected to said first node and responsive to a voltage at said first node to output an inverted voltage with a delay,
   second switching means connected between a predetermined second potential and said first node and operable in response to the inverted voltage output by said first inverter means,
   potential holding means for holding the output of said first inverter means at a predetermined third potential, and
   amplification means responsive to the output potential of said first inverter means to output amplified signals.

2. The semiconductor memory device according to claim 1, wherein said potential holding means is connected between said second potential and the output of said first inverter means.

3. The semiconductor memory device according to claim 2, wherein said potential holding means includes third switching means connected between said second potential and the output of said first inverter means and adapted to be turned on responsive to the output signal of said first inverter means.

4. The semiconductor memory device according to claim 3 wherein said third switching means includes
   diode means connected between said second potential and the output of said first inverter,
   said diode means being connected in a direction for coupling said second potential to the output of said first inverter.

5. The semiconductor memory device according to claim 4, wherein said diode means includes
    at least one first field effect transistors of a conductivity type having a source electrode, a drain electrode and a gate electrode,
    said first field effect transistor having its drain electrode and its gate electrode connected together for receiving said second potential and having its source electrode connected to the output of said first inverter means.

6. The semiconductor memory device according to claim 1, wherein
    said switching means includes a second field effect transistor of a conductivity type having a source electrode, a drain electrode and a gate electrode,
    said second field effect transistor having its drain electrode connected to said second potential, its source electrode connected to said first node and said gate electrode connected to the output of said first inverter means.

7. The semiconductor memory device according to claim 6 wherein
    said first potential comprises a ground potential (GND),
    said second potential comprises a source potential and
    said conductivity type comprises an N type.

8. The semiconductor memory device according to claim 1, wherein
    said amplification means includes a second inverter means connected to the output of said first inverter means and responsive to the output potential of said first inverter means to output an inverted voltage.

9. The semiconductor memory device according to claim 8, wherein
    said first and second inverter means include complementary type inverters.

10. The semiconductor memory device according to claim 1, wherein
    said semiconductor memory device comprises a read only memory.

11. A sense amplifier for amplifying input signals supplied to an input node, said input node being brought to a predetermined first potential before input signals are supplied thereto, said sense amplifier comprising:
    an inverter means connected to said input node and responsive to the voltage at said input node to output an inverted voltage with a delay,
    a switching means connected between a predetermined second potential and said input node and operable in response to the inverted voltage output by said inverter means,
    a potential holding means, connected between said second potential and the output of said inverter means, and for holding the output of said inverter means at a predetermined third potential intermediate between said first and second potential, and
    amplification means coupled to the output of said inverter means and responsive to the inverter output voltage output by said inverter means to output amplified signals.

12. A method of increasing the speed of response of a sense amplifier comprising:
    an inverter means connected to an input node responsive to the voltage at said input node for outputting an inverted voltage with a delay,
    said input node being brought to a predetermined first potential before input signals are supplied thereto,
    a switching means connected between a predetermined second potential and said input node and operable in response to the output voltage of said inverter means, and
    an amplification means responsive to the output voltage of said inverter means for outputting amplified signals,
    said method comprising the steps of:
    establishing a third potential intermediate between said first and second potential,
    performing a first access operation by bringing said input node to said first potential and supplying an input signal thereto, and
    holding the output of said inverter means at said third potential until a second access operation is performed.

* * * * *